(12) United States Patent
Forrest et al.

(10) Patent No.: US 9,496,315 B2
(45) Date of Patent: Nov. 15, 2016

(54) TOP-GATE BOTTOM-CONTACT ORGANIC TRANSISTOR

(75) Inventors: Stephen R. Forrest, Ann Arbor, MI (US); Xin Xu, Ann Arbor, MI (US); Christopher Kyle Renshaw, Ann Arbor, MI (US)

(73) Assignee: Universal Display Corporation, Ewing, NJ (US)

( * ) Notice: Subject to any disclaimer, the term of this patent is extended or adjusted under 35 U.S.C. 154(b) by 953 days.

(21) Appl. No.: 12/859,496

(22) Filed: Aug. 19, 2010

(65) Prior Publication Data

US 2011/0049489 A1 Mar. 3, 2011

Related U.S. Application Data

(60) Provisional application No. 61/275,154, filed on Aug. 26, 2009, provisional application No. 61/279,319, filed on Oct. 19, 2009.

(51) Int. Cl.
| | |
|---|---|
| *H01L 51/44* | (2006.01) |
| *H01L 27/30* | (2006.01) |
| *B82Y 10/00* | (2011.01) |
| *H01L 27/28* | (2006.01) |
| *H01L 51/10* | (2006.01) |
| *H01L 51/00* | (2006.01) |
| *H01L 51/05* | (2006.01) |
| *H01L 51/42* | (2006.01) |

(52) U.S. Cl.
CPC .............. *H01L 27/307* (2013.01); *B82Y 10/00* (2013.01); *H01L 27/283* (2013.01); *H01L 51/105* (2013.01); *H01L 51/0046* (2013.01); *H01L 51/0078* (2013.01); *H01L 51/0541* (2013.01); *H01L 51/424* (2013.01)

(58) Field of Classification Search
CPC ... B82Y 10/00; H01L 27/283; H01L 27/307; H01L 51/105; H01L 51/424; H01L 51/0078; H01L 51/0541; H01L 51/0046
USPC ............................... 257/40, E51.013; 438/99
IPC ................. B82Y 10/00; H01L 27/283, 27/307, H01L 51/105, 51/424, 51/0078, 51/0541, H01L 51/0046
See application file for complete search history.

(56) References Cited

U.S. PATENT DOCUMENTS

| | | |
|---|---|---|
| 6,013,982 A | 1/2000 | Thompson et al. |
| 6,087,196 A | 7/2000 | Sturm et al. |

(Continued)

OTHER PUBLICATIONS

R. Bhattacharya et al., "Plastic deformation of a continuous organic light emitting surface", Applied Physics Letters 88, 033507, 2006, 3 pages.

(Continued)

*Primary Examiner* — Hrayr A Sayadian
(74) *Attorney, Agent, or Firm* — Riverside Law LLP

(57) ABSTRACT

Top-gate, bottom-contact organic thin film transistors are provided. The transistors may include metal bilayer electrodes to aid in charge movement within the device. In an embodiment, an organic transistor includes a drain electrode and a source electrode disposed over a first region of a substrate, a transition metal oxide layer disposed over and in direct physical contact with the drain electrode and the source electrode, an organic preferentially hole conducting channel layer disposed over the metal oxide and between the drain electrode and the source electrode, and a gate electrode disposed over the channel.

20 Claims, 13 Drawing Sheets

(56) References Cited

U.S. PATENT DOCUMENTS

| | | | |
|---|---|---|---|
| 6,100,549 | A * | 8/2000 | Weitzel et al. ............... 257/194 |
| 6,294,398 | B1 | 9/2001 | Kim et al. |
| 6,337,102 | B1 | 1/2002 | Forrest et al. |
| 6,468,819 | B1 | 10/2002 | Kim et al. |
| 7,230,269 | B2 | 6/2007 | Rand et al. |
| 7,279,704 | B2 | 10/2007 | Walters et al. |
| 7,375,370 | B2 | 5/2008 | Forrest et al. |
| 7,431,968 | B1 | 10/2008 | Shtein et al. |
| 2006/0027860 | A1 * | 2/2006 | Nomoto ..................... 257/327 |
| 2006/0214312 | A1 * | 9/2006 | Wu et al. ..................... 257/787 |
| 2007/0108890 | A1 | 5/2007 | Forrest |
| 2008/0202673 | A1 * | 8/2008 | Forrest et al. ............... 156/232 |
| 2010/0080914 | A1 * | 4/2010 | Forrest et al. ............... 427/259 |
| 2011/0049489 | A1 * | 3/2011 | Forrest ................... B82Y 10/00 257/40 |

OTHER PUBLICATIONS

J. Hwang et al., "Energetics of metal-organic interfaces: New experiments and assessment of the field", Materials Science and Engineering R 64 (2009) pp. 1-31.

Chu et al., "High-performance organic thin-film transistors with metal oxide/metal bilayer electrode", Applied Physics Letters 87, 193508, 2005, 3 pages.

S. Forrest, "The path to ubiquitous and low-cost organic electronic appliances on plastic", Nature, vol. 428, Apr. 2004, pp. 911-918.

Nausieda et al., "An Organic Active-Matrix Imager", IEEE Transactions on Electron Devices, vol. 55, No. 2, Feb. 2008, pp. 527-532.

Newman et al., "High mobility top-gated pentacene thin-film transistors", Journal of Applied Physics 98, 084506, 2005, 6 pages.

Renshaw et al., "Asic Image Sensors" CH2868-8/90/0000-303$1.© 1990 IEEE, pp. 3038-3041.

Renshaw et al., "Organic Electronics" Organic Electronics 11 (2010) 175-178, pp. 175-178.

Rogers et al., "Materials and Mechanics for Stretchable Electronics", *Science* 327, 1603 (2010); pp. 1603-1607.

Someya et al., "Integration of Organic FETs With Organic Photodiodes for a Large Area, Flexible, and Lightweight Sheet Image Scanners", IEEE Transactions on Electron Devices, vol. 52, No. 11, Nov. 2005, pp. 2502-2511.

Someya et al., "A large-area, flexible pressure sensor matrix with organic field-effect transistors for artificial skin applications", PNAS, Jul. 6, 2004, vol. 101, No. 27, pp. 9966-9970.

F. Taghibakhsh et a;l, "High dynamic range 2-TFT amplified pixel sensor architecture for digital mammography tomosynthesis", IET Circuits Devices Syst., 2007, 1, (1), pp. 87-92.

Xu et al., "Organic photodetector arrays with indium tin oxide electrodes patterned using directly transferred metal masks", Applied Physics Letters 94, 043313 _2009, 3 pages.

Xu et al., "Direct transfer patterning on three dimensionally deformed surfaces at micrometer resolutions and its application to hemispherical focal plane detector arrays", Organic Electronics 9 (2008) ,pp. 1122-1127.

Zhou et al. "All-organic active matrix flexible display" Applied Physics Letters 88, 083502, 2006, 3 pages.

\* cited by examiner

FIG. 11B
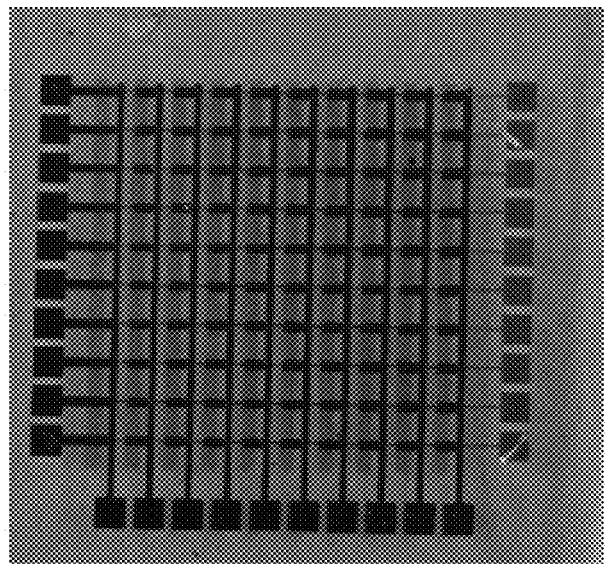
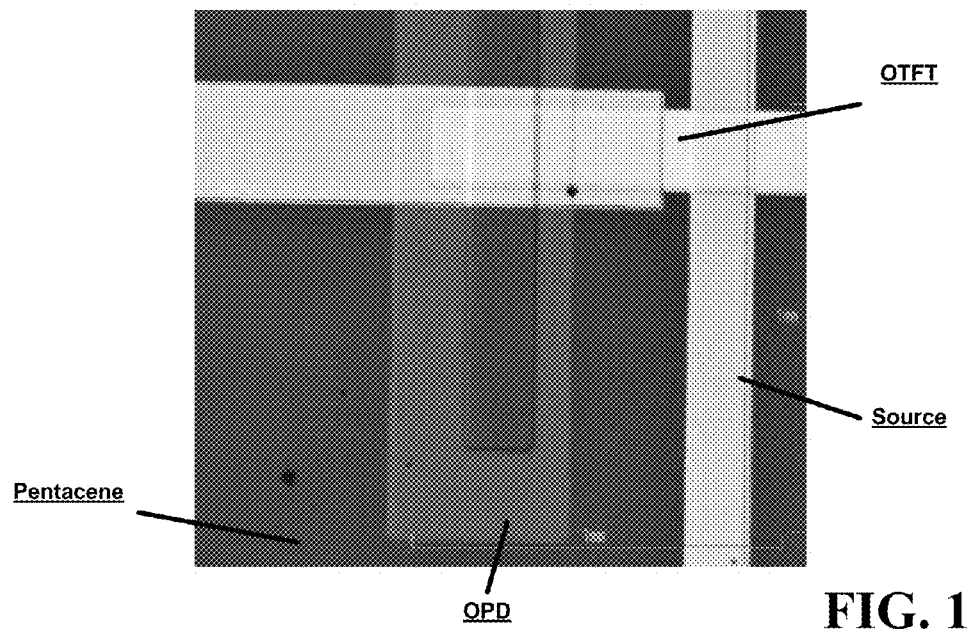
FIG. 11C

TOP-GATE BOTTOM-CONTACT ORGANIC TRANSISTOR

CROSS-REFERENCE TO RELATED APPLICATIONS

This application claims priority to U.S. Provisional Application No. 61/279,319, filed Oct. 19, 2009, and U.S. Provisional Application No. 61/275,154, filed Aug. 26, 2009, the disclosure of each of which is incorporated by reference in its entirety.

GOVERNMENT SUPPORT

This invention was made with government support under W15P7T-08-C-P409 awarded by U.S. ARMY/CECOM. The government has certain rights in the invention.

JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic devices and integrated organic devices, and more specifically to an organic top-gate, bottom-contact thin film transistor that may be integrated with a photodetector, and an array of such components.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photo detectors.

Photosensitive optoelectronic devices convert electromagnetic radiation into electricity. Solar cells, also called photovoltaic (PV) devices, are a type of photosensitive optoelectronic device that is specifically used to generate electrical power. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation. Photosensitive devices may be used in a range of devices, including photodetectors, imaging devices, photosensors, and the like. Photosensitive devices and their fabrication and operation are further described in U.S. Pat. Nos. 7,375,370 and 7,230,269, the disclosures of which are incorporated herein in their entirety.

In addition to organic photosensitive and emissive devices, organic materials may be used in various other electronic components. For example, organic transistors may be constructed in which some or all of the materials or structures in the transistor include organic materials.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, and as would be generally understood by one skilled in the art, a first work function is "greater than"

or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on organic devices, and the definitions described above, can be found in U.S. Pat. No. 7,279,704, which is incorporated herein by reference in its entirety.

SUMMARY OF THE INVENTION

Top-gate, bottom-contact organic thin film transistors are provided that may be used in integrated devices such as sensor pixels, full imaging sensors, and the like. The transistors may include metal bilayer electrodes to aid in charge movement within the device.

In an embodiment, an organic transistor includes a drain electrode and a source electrode disposed over a first region of a substrate; a transition metal oxide layer disposed over and in direct physical contact with the drain electrode and the source electrode; an organic preferentially hole conducting channel layer disposed over the metal oxide and between the drain electrode and the source electrode; and a gate electrode disposed over the channel.

In some configurations, an organic photodetector may be disposed over a second region of the substrate and adjacent to the organic transistor, and the drain electrode extended over the second region of the substrate to form an electrode of the photodetector.

In an embodiment, a method of fabricating a device includes depositing a drain electrode and a source electrode over a substrate; depositing a transition metal over the drain electrode and the source electrode; depositing an organic preferentially hole conducting material over the first layer and between the drain electrode and the source electrode; and depositing a gate electrode over the second layer.

The method may further include depositing or otherwise fabricating an organic photodetector on a second region of the substrate and adjacent to the organic transistor, such that the drain electrode extends over the second region of the substrate to form an electrode of the photodetector. A plurality of transistors or integrated transistor/photodetectors also may be fabricated in an array.

In the various embodiments described herein, the channel layer may be disposed in direct physical contact with the metal oxide. The transition metal may include molybdenum, tungsten, titanium, nickel, copper, or vanadium. A preferred metal oxide includes $MoO_3$. The channel layer may include pentacene. The drain and source electrodes may include gold. The gate electrode may include parylene-C, or may include a gate insulator layer which may include parylene-C. The surface of the substrate may be a non-developable surface.

In some embodiments, a device may include an organic transistor as described herein, and/or an intergrated photodetector or other photosensitive component. Such devices may include imaging sensors, cameras, and the like. In some configurations, the device may include an array of organic transistors, which may have integrated photosensitive components. Embodiments of the invention may include techniques for fabricating these various devices.

In an embodiment, a method of fabricating an integrated device may include masking a first region of a substrate and a second region of the substrate adjacent to the first region; depositing a first electrode over a third region of the substrate adjacent to the first region; depositing a first layer comprising an organic photoactive material over the first electrode; unmasking the first region of the substrate; depositing a second electrode over the organic photoactive layer and over the first region of the substrate; unmasking the second region of the substrate and masking a portion of the second electrode disposed over the third region of the substrate; depositing a third electrode over the second region of the substrate; depositing a second layer comprising an organic channel material over the third electrode and an unmasked portion of the second electrode and between the second and third electrodes; and depositing a fourth electrode over the organic channel material.

In an embodiment, the method may further include depositing a fourth layer comprising a transition metal oxide over the third electrode and over a portion of the second electrode disposed over the first region of the substrate, and in direct physical contact with the second and third electrodes.

In an embodiment, an integrated transistor and photodetector may include a first electrode disposed over a substrate; a first layer comprising an organic photoactive material disposed over the first electrode; a second electrode disposed over the first layer and over a region of the substrate non-overlapping with the first electrode and the first layer; a third electrode disposed over the substrate and adjacent to at least a portion of the second electrode; a second layer comprising an organic channel material disposed over and between the second electrode and the third electrode; and a fourth electrode disposed over the second layer. The integrated device may include a transition metal oxide disposed over the second and third electrodes. The second layer may include an organic preferentially hole conducting material. Some embodiments may include an array of integrated devices.

BRIEF DESCRIPTION OF THE DRAWINGS

FIG. 11B shows a photograph of a 10×10 integrated array with transparent indium tin oxide (ITO) anodes with patterned 1 mm squares on each side for easy contacting with probes according to embodiments of the invention.

FIG. 11C shows a microscopic image of a single integrated pixel in a 10×10 array according to embodiments of the invention. The area of organic photodetector (OPD) is 280×350 μm². The W/L is defined by the width of the gate and channel length, which is 280 μm/80 μm. The OPD materials are patterned over the anode stripe but not at the organic thin film transistor (OTFT) channel, therefore, the photocurrent of the OPD will not create leakage through the OTFT.

FIG. 12 C shows the power intensity dependent photocurrent of the OPD illuminated at a wavelength of 578 nm according to embodiments of the invention, with the linear fit of log(ΔI) to log(P) (red line), representing the dynamic range of the photodiode.

DETAILED DESCRIPTION

Although the use of organic materials in various electronic components, such as transistors, is not unknown, in general organic materials cannot be arbitrarily inserted into or used in such devices. For example, in devices that use both organic devices and metal electrodes or other components, it may not be possible for any arbitrary layer or component in the device to include organic materials due to the relative fragility of the organic materials. A common problem is that the deposition of metals, especially by way of high-temperature or related methods, may damage underlying organic layers. Further, the specific order in which organic and non-organic materials are deposited, and the relative distances between various layers, may have a significant impact on the performance of the device. Thus, in general it may not be possible to use organic materials in an arbitrary capacity in an organic semiconductor device.

Figure 1:
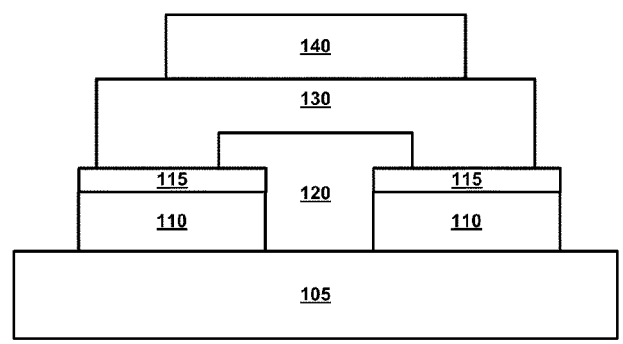
FIG. 1 shows an example organic transistor according to embodiments of the present invention.

FIG. 1 shows an example organic transistor according to embodiments of the present invention. The transistor may include drain and source electrodes 110 disposed over a first region of a substrate 105. Various materials may be used to fabricate the drain and source electrodes, with gold being preferred. A layer of a transition metal oxide 115 may be deposited over and in direct physical contact with the drain and source electrodes. Suitable transition metals include molybdenum, tungsten, titanium, nickel, copper, and vanadium. Various oxides as would be known to one of skill in the art may be used, with MoO$_3$ believed to be particularly effective.

A layer including an organic preferentially hole conducting semiconductor material may be disposed over the metal oxide layer 115 and between the drain and source electrodes as a channel 120. The term "preferentially hole conducting" refers to the material's relative preference to conduct holes as opposed to electrons during use of the device shown in FIG. 1. In other devices and configurations, similar materials may be referred to as "p-type" semiconductors. In contrast to a theoretical p-type semiconductor, a preferentially hole conducting layer or material may also conduct or be made to conduct electrons, though any such effect is negligible unless specifically indicated otherwise herein. The channel 120 preferably includes pentacene. In some configurations the organic channel material may be placed in direct physical contact with the metal oxide layer. A gate dielectric or insulator 130 may be disposed over the metal oxide-coated electrodes and the channel as shown, and a gate electrode 140 disposed over the gate insulator 130. Parylene-C may be preferred for the gate insulator 130. A specific example of a device as illustrated in FIG. 1 and associated operational results is provided below.

Devices as illustrated in FIG. 1 and as described herein may be referred to as "bottom contact" devices, because the drain and source contacts are deposited before the preferentially hole conducting organic channel material is deposited. They also may be referred to as "top gate" devices, because the gate dielectric 130 and gate electrode 140 are deposited over the other layers. A bottom contact device as described herein may present fabrication options not available in a top contact device.

For example, fabrication of a top contact device would typically require deposition of metal contacts on an organic channel, resulting in a metal-on-organic interface. Because small molecule organic materials are relatively soft materials bound by the weak van der Waals force, the metal atoms may carry sufficient thermal energy to damage the organic surface and diffuse deep into organic film. Thus, a top contact device often includes an additional transition layer between the metal contacts and the organic channel. For example, C—W. Chu et al. (Appl. Phys. Lett. 87 193508 (2005)) describe a top contact device in which a $MoO_3$ transition layer is disposed between the contacts and the channel to prevent damage to the organic layer.

In devices according to the present invention, the drain and source contacts are deposited before the organic channel material is deposited. Thus, the deposition results in an organic-on-metal interface if the channel material is deposited directly on the contacts. The morphology and charge injection of a metal-on-organic interface is quite different from an organic-on-metal interface. Organic-on-metal deposition does not present the same risk of damage to the organic layers as metal-on-organic, so no transition layer is required to prevent damage to the organic channel or other organic layers. Thus, device configurations as described herein may allow for different combinations of materials than in top contact devices such as those described in Chu et al.

In some configurations such as illustrated in FIG. 1, additional layers may be included to adjust work functions within the device, or to achieve more efficient charge carrier injection barriers. For example, the work function of $MoO_3$ is 5.3 eV, which is suitable to provide carrier injection between $MoO_3$ and pentacene. Thus, a OTFT device with $MoO_3$/metal bilayer electrodes may achieve improved current when the gate is turned on, compared to a device with only metal electrodes. As illustrated in FIG. 1, $MoO_3$/metal bilayer electrodes may be used in conjunction with a pentacene channel, even though no separate $MoO_3$ layer is necessary to protect the organic channel.

Figure 2:
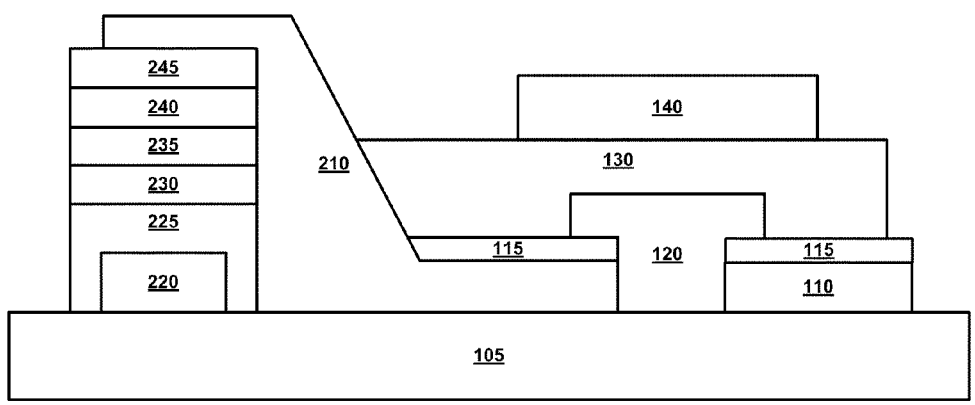
FIG. 2 shows an example of a combined organic transistor and photodetector according to embodiments of the invention.

Organic transistors as described herein may be integrated with or used in a variety of devices. FIG. 2 shows an example of a combined organic transistor and photodetector according to embodiments of the invention. The device includes a bottom-contact organic transistor, as described with respect to FIG. 1, that is integrated with a photosensitive device 200 by way of a shared electrode 210. For example, the organic photodetector may be fabricated on a region of substrate adjacent to the transistor, and the drain electrode 210 extended over this second region to form a top electrode of the photodetector.

The photosensitive device 200 includes a bottom electrode 210 and the top electrode 210 that is shared with the transistor, and one or more photoactive layer 230, 235. Various other layers may be included, as will be understood by one of skill in the art. For example, one or more hole transport and/or electron blocking layers 225 may be included between one electrode 220 and the photoactive layers. Similarly, one or more exciton blocking and/or electron transport layers 240 may be included between the other electrode and the photoactive layers. An electrode layer 245 may be used to define the photodetector region. In one specific example, the photodetector may include an ITO electrode 220, a $MoO_3$ hole transport and electronic blocking layer 225, SubPc and $C_{60}$ photoactive layers 230, 235, a BCP exciton blocking and electron transport layer 240, and an Al electrode layer 245. A specific example of a device as illustrated in FIG. 2 and associated operational results is provided below.

Embodiments of the invention such as the integrated device illustrated in FIG. 2 may provide for integrated switching or other control of the detector. For example, the integrated device may be used as a pixel in an imaging sensor, and an array of devices such as the device of FIG. 2 may be fabricated to create an imaging sensor. Such a sensor may be used, for example, as a focal plane sensor in the devices described in U.S. Patent Pub. No. 2007/0108890, filed Nov. 15, 2005, the disclosure of which is incorporated by reference in its entirety.

As described in further detail below, a device as shown in FIG. 2 may be fabricated in general by depositing the illustrated layers in the order shown. For example, the photodetector layers may be deposited in the order shown over a first area of a substrate. The transistor layers may be fabricated subsequently or concurrently over an adjacent area of the substrate, using the common electrode as shown. Each portion of the substrate and any layers disposed over it may be masked during deposition on a different region. For example, the transistor region may be masked during deposition of the photodetector, and the photodetector region and any deposited layers may be masked during deposition of the transistor.

As a specific example, an integrated device may be fabricated by first masking a first region of a substrate and a second region of the substrate adjacent to the first region. A first electrode may then be deposited over a third region of the substrate adjacent to the first region, and a photodetector including at least one photoactive layer deposited over the first electrode. The first region of the substrate may then be unmasked, and a second electrode deposited over the organic photoactive layer and over the first region of the substrate to form the shared photodetector/TFT electrode. The second region may be unmasked, and a portion of the second electrode that is disposed over the third region of the may be masked. A third electrode may be deposited over the second region of the substrate, and an organic channel material deposited over the third electrode and the unmasked portion of the second electrode, and between the second and third electrodes to form the TFT channel. The gate electrode may then be deposited over the organic channel material.

It has been found that the use of organic materials and the integration of photodetectors and organic thin film transistors may provide benefits over other configurations and/or fabrication techniques. For example, the integrated devices described in T. Someya et al., IEEE Transactions On Electron Devices 55, 2 (2008) typically require laser processes, photolithography, and reactive ion etching to achieve interconnection between the photodetectors and thin film transistors. In many cases, the two components must be fabricated separately and then combined in an additional processing step. In contrast, the integrated devices described herein may be achieved via layer-by-layer growth, without extra steps that may involve wet chemistry or introduce damage to the sensitive organic layers or other device components.

Figure 11A:
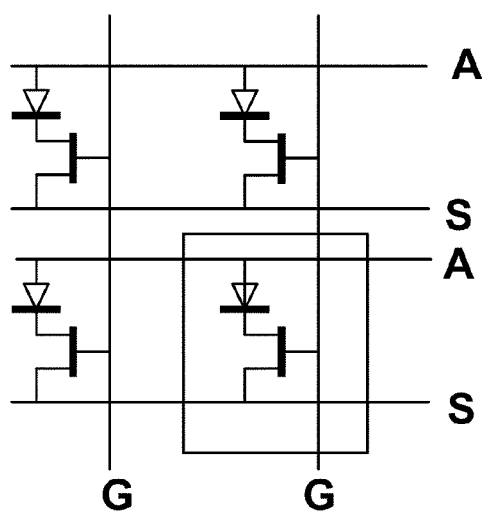
FIG. 11A shows an illustration of a circuit for an image sensor array with integrated pixels according to embodiments of the invention.

In some embodiments, multiple integrated organic TFT/photodetector components may be arranged in an array, for example, for use as the imaging sensor in a photosensor, camera, or other imaging device or sensor. FIG. 11A shows an example circuit diagram of such an array. A specific example of a technique for fabricating an array of integrated components is provided below.

Integrated organic TFTs and photosensitive devices may be useful in a variety of imaging, sensor, and display applications. In some devices, photodetector arrays are configured such that the current measured by probing a cathode column and an anode row electrode is the sum of the currents from the pixel at the intersection and others sharing a common column or row within the passive matrix. This can significantly lower the array sensitivity, leading to a decreased resolution or efficiency for the device. In the present configurations, each transistor is controlled by a gate row electrode, as shown in FIG. 11A. When a gate row is at ground, each pixel on that row stores photocurrent on the photodetector junction capacitance. When a negative gate voltage is applied to a gate row, a row of transistors are switched to the ON (i.e. conducting) state, and the stored charge is then read out through the OTFT and collected at each source column. Thus, integrated arrays of photodetectors and thin film transistors are more suitable for such an application.

Due to the room temperature fabrication used, and the use of relatively soft organic materials, it is feasible to build devices described herein, including an organic passive pixel sensor array, on a flexible substrate or other curved surfaces. For example, three-dimensional cold welding and other similar techniques may be used to fabricate hemispherical or other shapes in focal plane arrays. Generally, devices and arrays of devices may be fabricated directly on a non-developable surface. As used herein and as will be readily understood by one of skill in the art, a non-developable surface is one that cannot be deformed into a plane without shrinking, stretching, or tearing the substrate.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

Device Examples and Experimental Results

A example top gate, bottom contact pentacene-based organic thin film transistor using molybdenum oxide ($MoO_3$) and metal bilayer electrodes was fabricated. The device was found to exhibit improved TFT performance compared to devices using metal electrodes.

A quartz substrate was first solvent cleaned and coated with 100 nm thick patterned Al or Au as drain/source (D/S) electrodes in a vacuum thermal evaporation (VTE) chamber. Then a 15 nm thick layer of $MoO_3$ was deposited on top of Al or Au using the same shadowing masks. Next, pentacene purified twice by thermal gradient sublimation was deposited at 0.1-0.5 Å/s rate on top of D/S contacts in the VTE chamber. A 400 nm thick parylene-C gate dielectric was deposited after vaporization and pyrolysis, followed by a 100 nm thick Ag gate electrode.

Channel widths of 100 and 500 microns were employed, each with lengths of 50 microns. During deposition, the device was kept in vacuum or $N_2$ box except when exposed to air after the cathode, pentacene, and parylene-C deposition steps.

Figure 3:
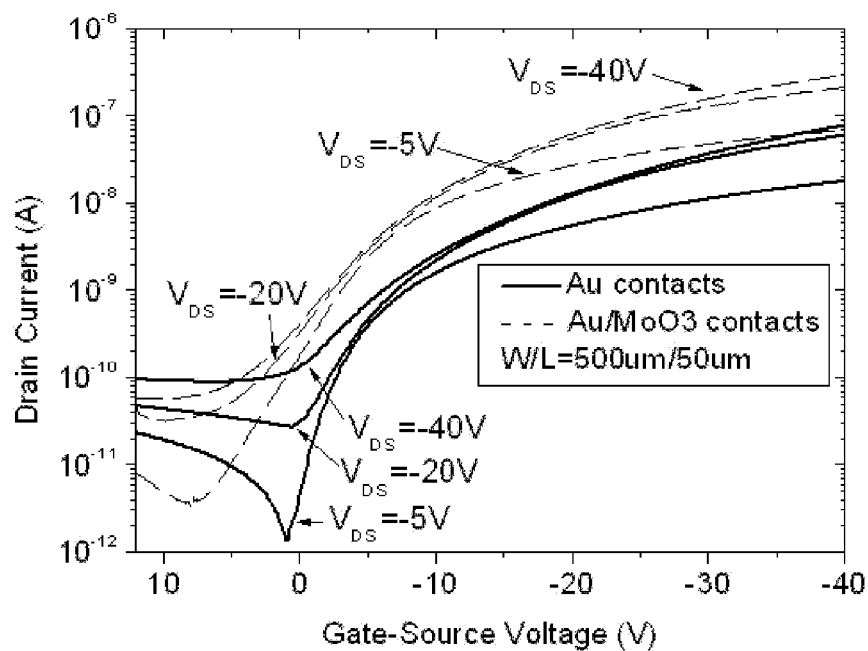
FIG. 3 shows a comparison of transfer characteristics of organic transistors with Au electrodes or $Au/MoO_3$ electrodes according to embodiments of the invention.
Figure 5:
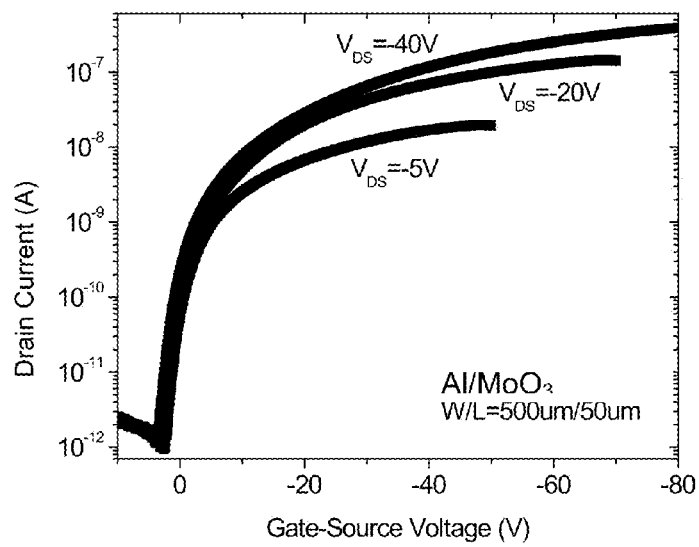
FIG. 5 shows ON/OFF characteristics for an organic transistor according to embodiments of the invention.
Figure 4:
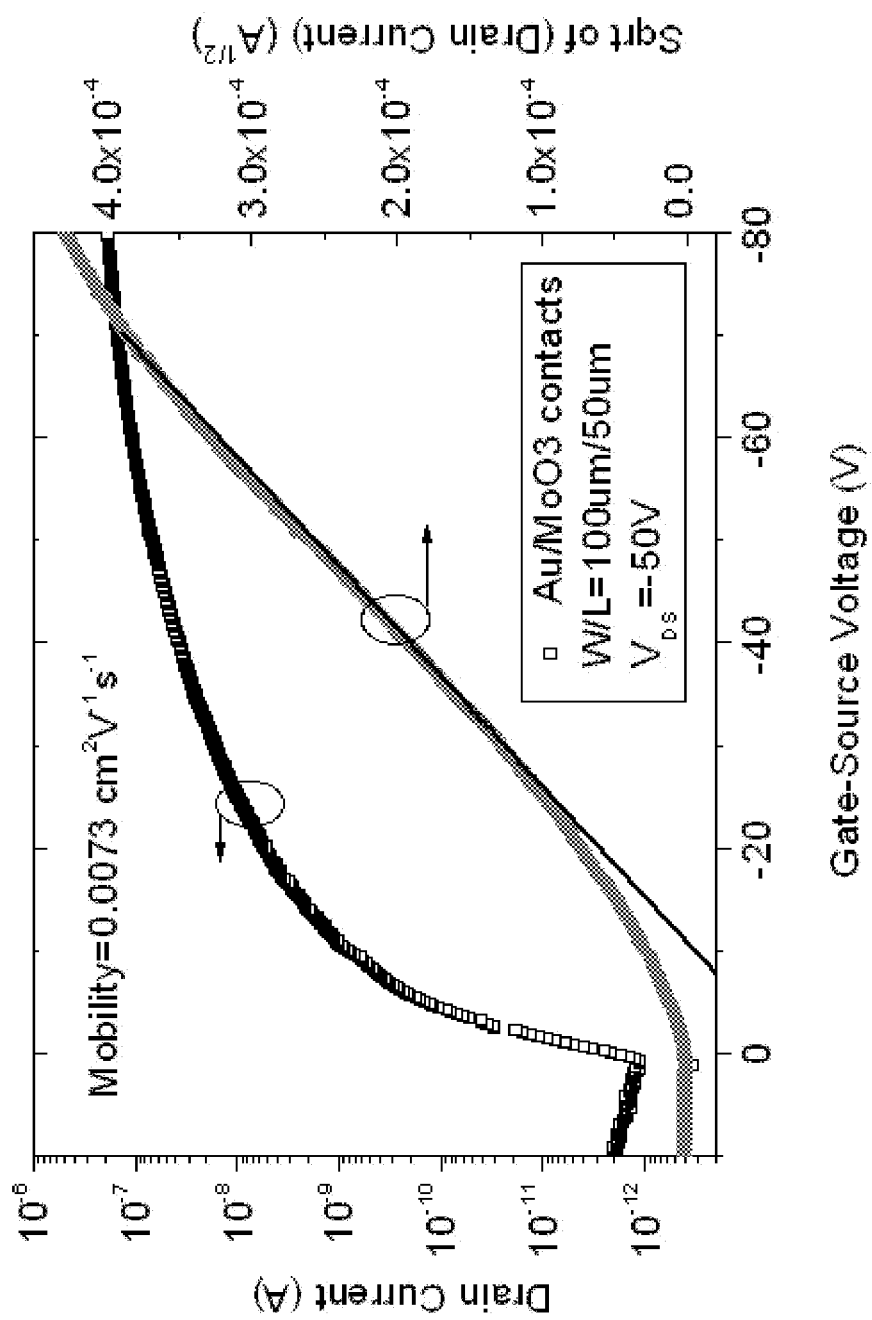
FIG. 4 shows pentacene mobility in an organic transistor according to embodiments of the invention.
Figure 6:
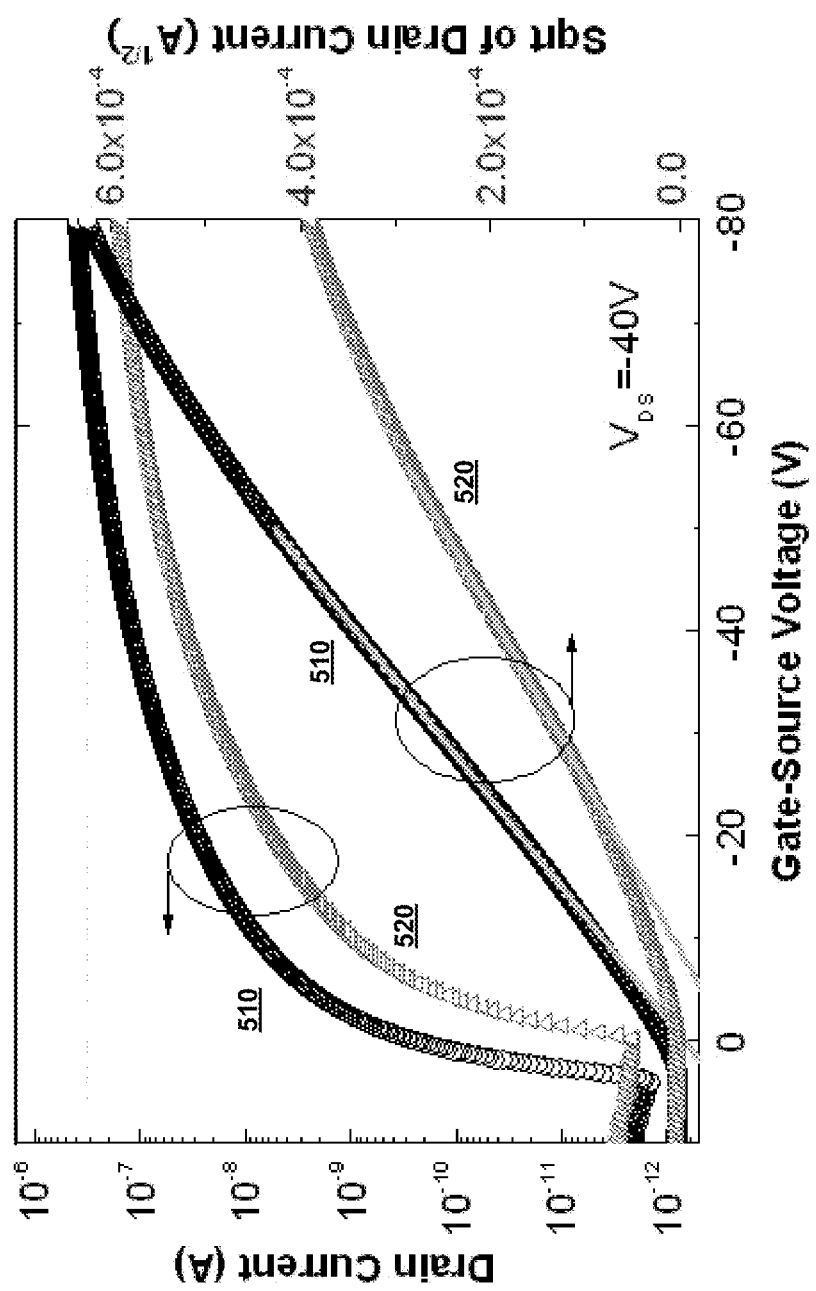
FIG. 6 shows the drain currents and gate-source voltages for $u=0.003$ $cm^2/vs$ and $u-0.006$ $cm^2/vs$ for a device according to embodiments of the invention.

The work function of $MoO_3$ is known as ~5.3 eV, which is suitable for carrier injection between $MoO_3$ and pentacene. Therefore, the OTFT with $MoO_3$/metal bilayer electrodes was found to exhibit improved current when the gate is turned on compared to a similar device with only metal electrodes. The transfer characteristics of OTFs with Au electrodes or Au/$MoO_3$ electrodes are compared in FIG. 3, which shows that the on current of the OTFT with Au/$MoO_3$ electrodes is increased relative to Au-only electrodes. A pentacene mobility of 0.0073 $cm^2$/Vs is achieved with a channel width of 100 μm and length of 50 μm at −50 V drain source bias, as shown in FIG. 4. The OTFTs with Al drain/source contacts exhibited no functionality. The drain current was found to be as small as 10 pA with a drain-source voltage of −40V and a gate-source voltage of −20 V. It is believed that this results from the misalignment in work function of Al and pentacene. Oxidation of Al can also eliminate the carrier injection at the contact/channel interface. However, the OTFTs with Al/$MoO_3$ electrodes achieve as high as $10^5$ on/off ratio when $V_{Ds}$=−40V, as shown in FIG. 5. The off status drain-source current remains as low as a few pA at various drain source voltages. The pentacene mobility is 0.006 cm$^2$/Vs for such an OTFT when W/L=100 µm/50 µm and is 0.003 cm$^2$/Vs when W/L=500 µm/50 µm. FIG. 6 shows the drain currents and gate-source voltages for u=0.003 cm$^2$/vs (510) and u-0.006 cm$^2$/vs (520). The top gate, bottom-contact devices were found to have a higher on/off ration and a lower off drain-source current than similar bottom-gate, top-contact devices as described in C—W. Chu et al., Appl. Phys. Lett. 87, 193508 (2005).

An example integrated organic photodetector (OPD) and pentacene-based organic thin film transistor (OTFT) was also fabricated. Such a device is suitable for use as an integrated, switchable pixel in a focal plane imaging sensor array or other similar device.

A device structure as illustrated in the cross-section shown in FIG. 2 was used. A glass substrate with commercially patterned 200 m wide, 100 nm thick indium tin oxide (ITO) stripes was first solvent cleaned and UV ozone treated. Then the OPD was fabricated in a vacuum thermal evaporation (VTE) chamber onto the glass substrate. All organic materials were purified by vacuum thermal gradient sublimation at 1×10$^{-6}$ torr, and were deposited at 1 Å/s unless otherwise stated. Prior to deposition of the photoactive layers, a 10 nm thick MoO$_3$ film was deposited on the ITO at 0.2 Å/s as a hole transport and electron blocking layer to reduce photodetector dark current. The photoactive layers included a 110 Å thick chloro[subphthalocyaninato]boron (III) (SubPc) layer and a 325 Å thick C$_{60}$ layer. A 40 Å thick film of bathocuproine (BCP) was deposited on top of the active layers as an exciton blocking and electron transport layer. Next, an 800 Å thick, 100 or 500 microns wide Al stripe was deposited by shadowing mask orthogonal to the anode stripe as the cathode to define the detector area.

The top-gate, bottom-contact OTFT was subsequently grown adjacent to the detector, with the drain integrated with the detector cathode. The OTFT layers were grown in a VTE chamber except for the parylene-C gate dielectric, which was deposited after vaporization and pyrolysis. The OTFT structure consists of (from substrate to top gate): a 625 Å thick Ag layer for the drain and source contacts, an 800 Å thick pentacene channel layer (deposited at 0.2 Å/s for the first 300 Å and 0.5 Å/s for remainder), a 250 nm thick parylene-C insulator, followed by a 1000 Å thick Ag gate electrode. Channel widths of 100 and 500 microns were employed, each with lengths of 25 and 50 microns. During deposition, the device was kept in vacuum or N$_2$ box except when exposed to air after the cathode, pentacene, and parylene-C deposition steps.

Figure 7:
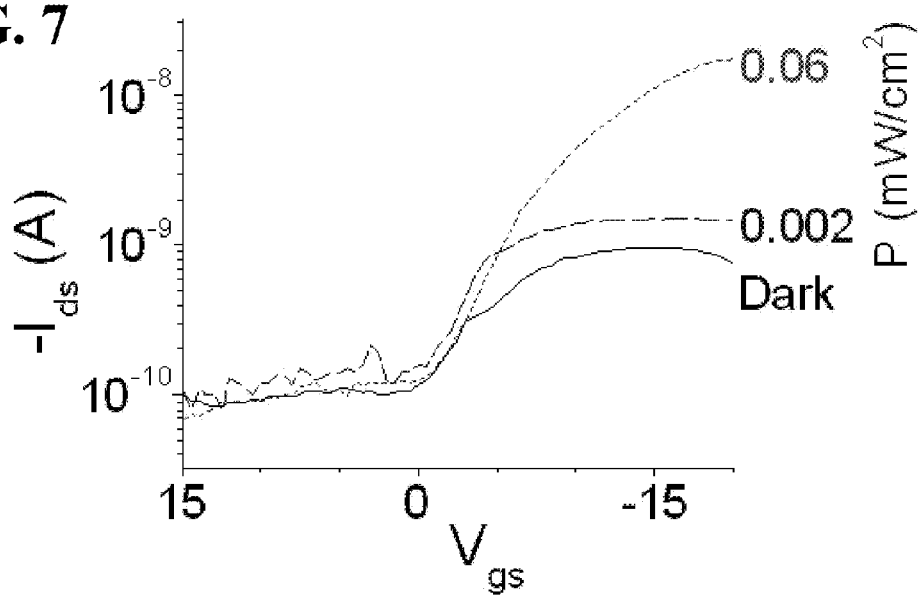
FIG. 7 shows ON/OFF characteristics for a photodetector according to embodiments of the invention.
Figure 8:
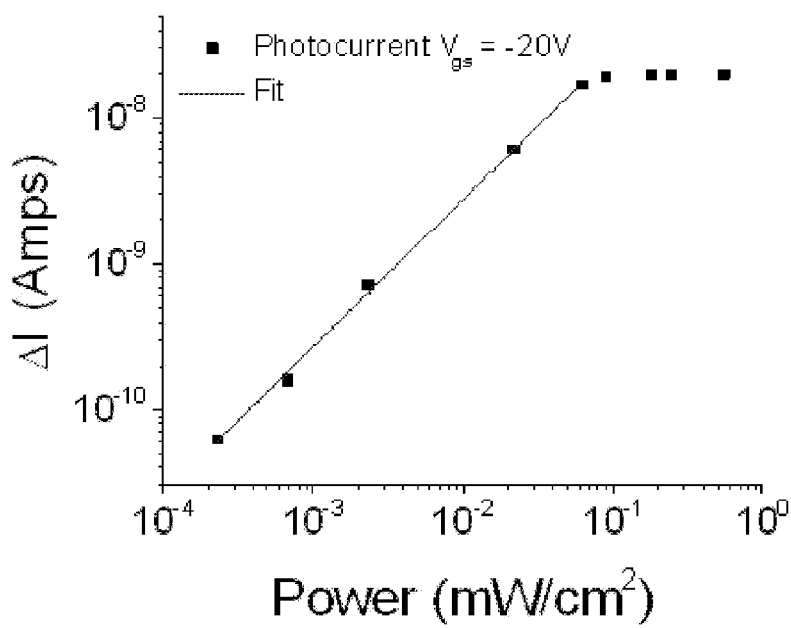
FIGS. 8-10 show dynamic range, spectral coverage, and switching frequency characteristics for an integrated device according to embodiments of the invention.
Figure 9:
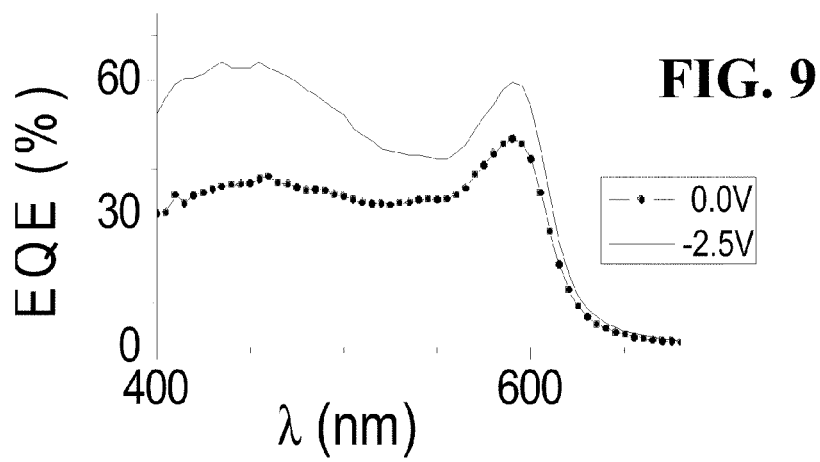
Figure 10:
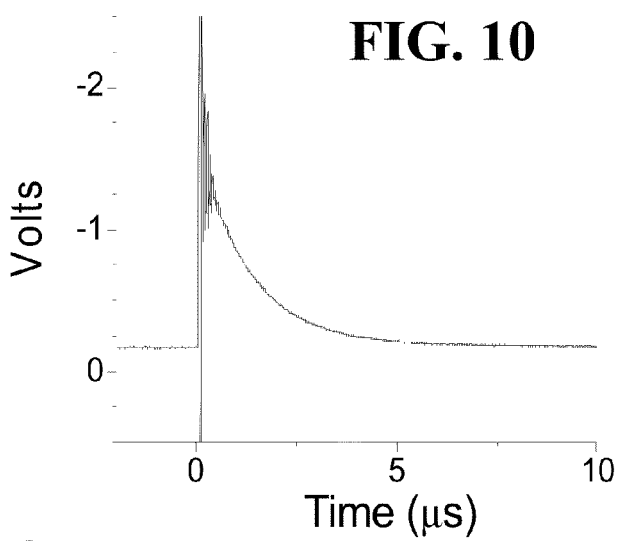

It was found that the OTFT allows the photodetector to be switched between an active (ON) state with a light intensity dependent photocurrent peaking at 20 nA and an inactive (OFF) state with current <50 pA (FIG. 7). The integrated device has a 9-bit dynamic range, spectral coverage from 400-600 nm, and a switching frequency >200 kHz (FIGS. 8-10). This indicates that the integrated pixel is suitable for application in an imaging sensor array, and may exhibit improved sensitivity relative to a photodetector-only array, such as those described in X. Xu, M. Mihnev, Andre Taylor, and S. R. Forrest, Appl. Phys. Lett. 94, 043313 (2009).

A 10×10 organic passive pixel sensor array that uses boron subphthalocyanine chloride (SubPc)/C$_{60}$ photodetectors monolithically integrated with a top gate, pentacene transistor with parylene-C as the gate insulator was fabricated. It was found that the integrated pixels have a dynamic range of 300 (corresponding to an approximately 8 bit resolution) and a 2.2 ms readout time, which is adequate for a 30 frames per second video standard.

The small molecule organic materials and the metal contacts of the integrated structure are patterned by vacuum thermal evaporation through aligned shadow masks. Each pixel in the array includes an anode and source column that are connected by a drain contact and a pentacene channel. The transistor is controlled by a gate row electrode, as shown in FIG. 11A. When a gate row is at ground, each pixel on that row stores photocurrent on the photodetector junction capacitance. When a negative gate voltage is applied to a gate row, a row of transistors are switched to the ON (i.e. conducting) state, and the stored charge is then read out through the OTFT and collected at each source column.

The 10×10 integrated array shown in FIG. 11B was patterned using a series of shadow masks aligned to 20 mm accuracy using locating pins mounted into a substrate holder. This registration is sufficient for the array whose feature size is about 100 µm. All material layers were grown in a vacuum thermal evaporation chamber (base pressure: 10$^{-7}$ Torr) after undergoing a single cycle purification via vacuum thermal gradient sublimation, except for pentacene with was purified in two cycles. The parylene C gate insulator was grown by vaporization and pyrolysis.

To fabricate the array, a substrate was placed on a substrate holder using double sided polyimide tape. Ten 40 nm thick Au semitransparent 280 µm wide by 1.7 cm long anode stripes were patterned. Next, a second mask was aligned to the anodes to pattern a 600 µm wide by 1.4 cm long photodetector region over the anode stripes. The OPD materials include a 10 nm thick MoO$_3$ electron blocking layer, a 11 nm thick SubPc donor, a 32.5 nm thick C$_{60}$ acceptor and a 10 nm bathocuproine (BCP) exciton blocking layer. The OPD layers were deposited about 300 µm away from the OTFT channel region to prohibit leakage current from the OPD from increasing the OFF state current of the OTFT. Next, a 100 nm thick Au and 15 nm thick MoO$_3$ bi-layer were patterned using a third mask aligned to the deposited patterns to define the drain interconnects and source contacts. It was found that the MoO$_3$ improves the hole injection into the pentacene. A 350 µm wide drain interconnect was deposited to overlap the anode column, forming a 280 µm×350 µm OPD, and creating a L=80 µm TFT channel with a 250 µm wide by 1.7 cm long source column parallel to anodes. Pentacene was then deposited at 0.2-0.5 Å/s to a thickness of 55 nm on top of drain/source contacts, followed by the deposition of a 370 nm thick parylene-C insulating layer over the entire surface. Finally, a 100 nm thick, 280 µm wide Ag gate row was deposited orthogonal to the anode and source stripes and overlaps the channel region forming OTFT region where W/L=280 µm/80 µm. FIG. 11C shows a microscopic image of one integrated pixel in the completed array.

Figure 12A:
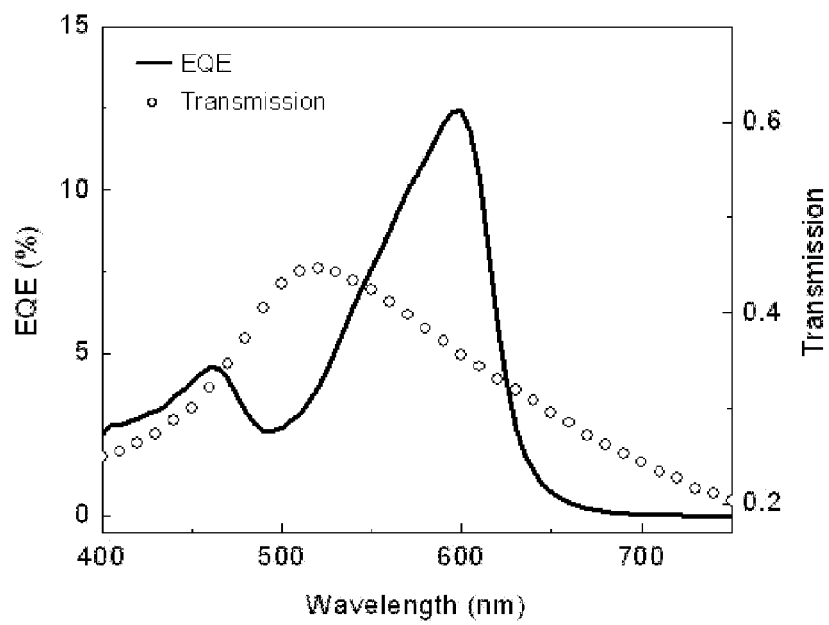
FIG. 12 A shows the transmission spectrum over the visible wavelength range of a 40 nm Au film and the external quantum efficiency (EQE) of a Au/MoO$_3$/SubPc/C$_{60}$/BCP/Au photodiode according to embodiments of the invention.
FIG. 12B shows current-voltage characteristics of an OPD from −1V to +1V bias illuminated at 578 nm with various light intensities according to embodiments of the invention.
FIG. 12D shows the transfer characteristic of the pentacene TFT at drain-source voltages of −2V, −5V, −10V with a W/L ratio of 280 μm/80 μm according to embodiments of the invention. Also shown is the square root of drain-source current, $(I_{DS})^{1/2}$ at drain-source voltage $V_{DS}$=−10V with a linear fit which gives the mobility of the OTFT, 0.004 cm²/Vs.
Figure 12B:
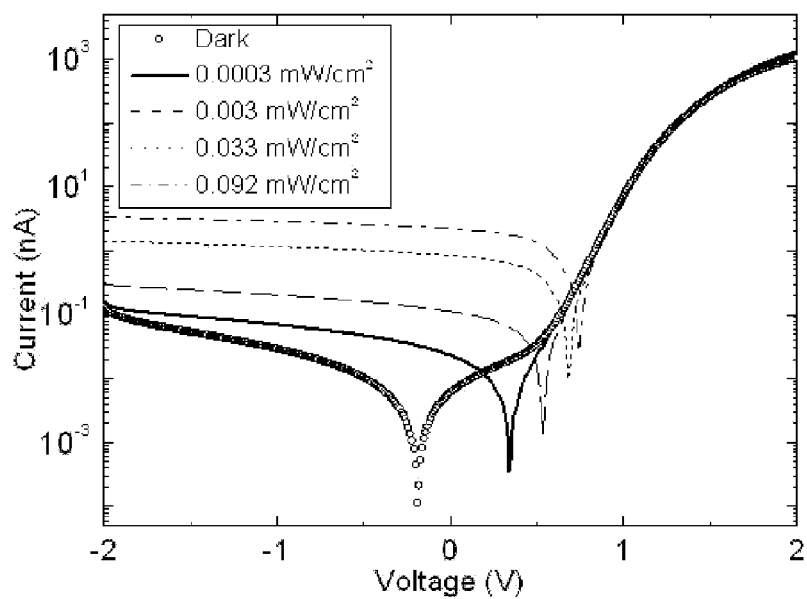
Figure 12C:
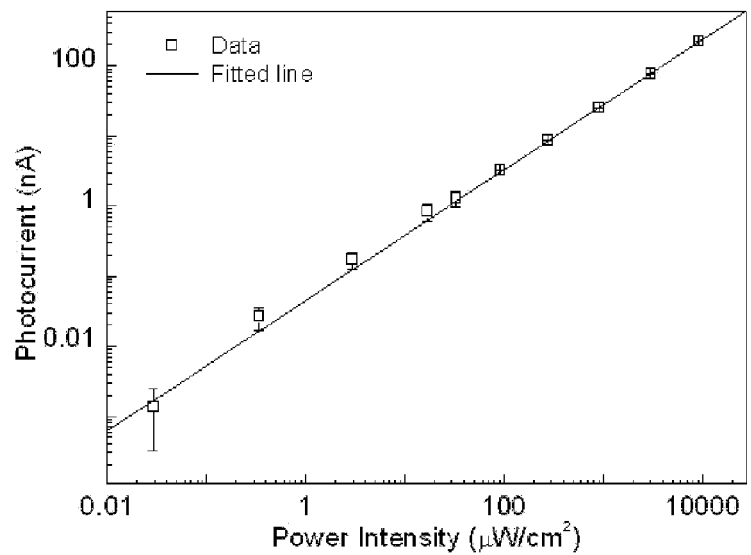

The leftmost column of drain interconnects were extended out to contact pads to enable independent measurement of the electrical characteristics of the OPD and OTFT. The external quantum efficiency at zero bias of the OPD was found to have a peak response of 12.4%±0.3% at a wavelength of 600 nm, as shown in FIG. 12A. The current-voltage characteristics of an OPD measured in the dark and under various illumination intensities at 578 nm are shown in FIG. 12B, with a rectification ratio in the dark of about 10$^4$ at an operation voltage of V=±2 V. As shown in FIG. 12C, the photocurrent was found to increase linearly with illumination intensity, resulting in a dynamic range of greater than 10$^5$, corresponding to greater than 16 bit resolution. The linear fit yields a slope of 0.932±0.002 mA-cm$^2$/W and an intercept of −4.26±0.01 nA, indicating a responsivity of 0.058±0.001 A/W, corresponding to an EQE of 12.5%±0.3% at λ=578 nm.

Figure 12D:
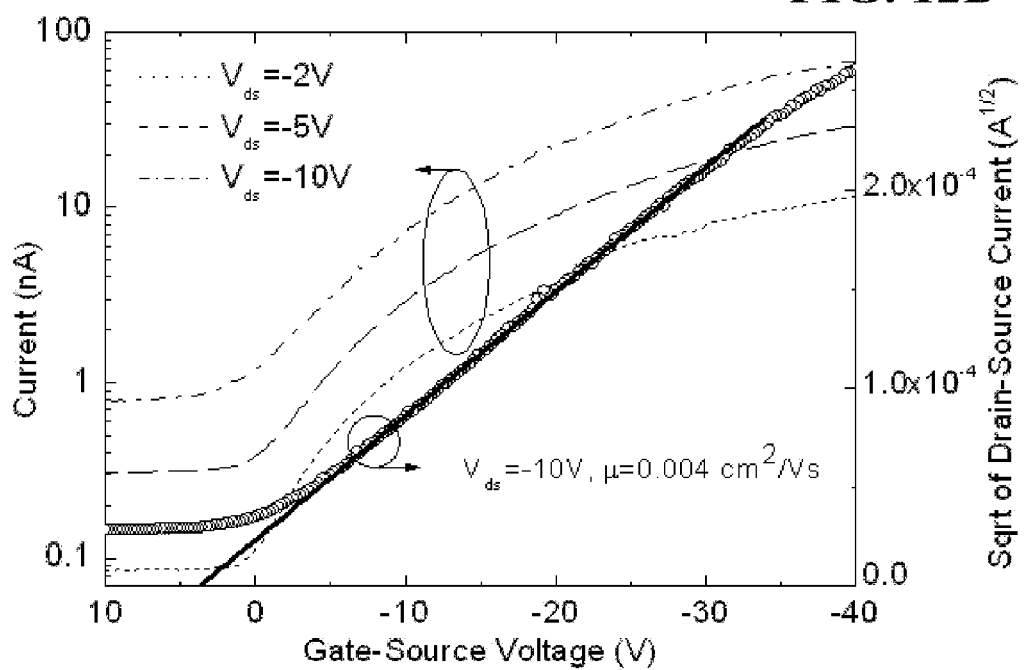

The drain-source current of the top-gate, bottom-contact pentacene TFT was measured at $V_{DS}$=−2V, −5V, −10V, showing an ON/OFF ratio of about 100 when the gate-source voltage, $V_{GS}$, was varied from +10 V to −40 V, as shown in FIG. 12D. The OTFT has an OFF current of 80 pA when $V_{DS}$=−2V. The mobility, μ, at $V_{DS}$=−10V is calculated to be 0.004 cm²/Vs according to the following equation:

$$I_{DS} = \frac{1}{2}\frac{W}{L}\mu C_i(V_{GS} - V_{th})^2,$$

where $C_i$=6.5 nF/cm² is the capacitance per unit area of the parylene-C gate dielectric. The threshold voltage is $V_{th}$=3.75 V. Because the pentacene transistor is grown in the top gate and bottom drain/source contact configuration, the mobility of the OTFT is about 25 times lower than an optimized bottom gate structure.

Figure 13A:
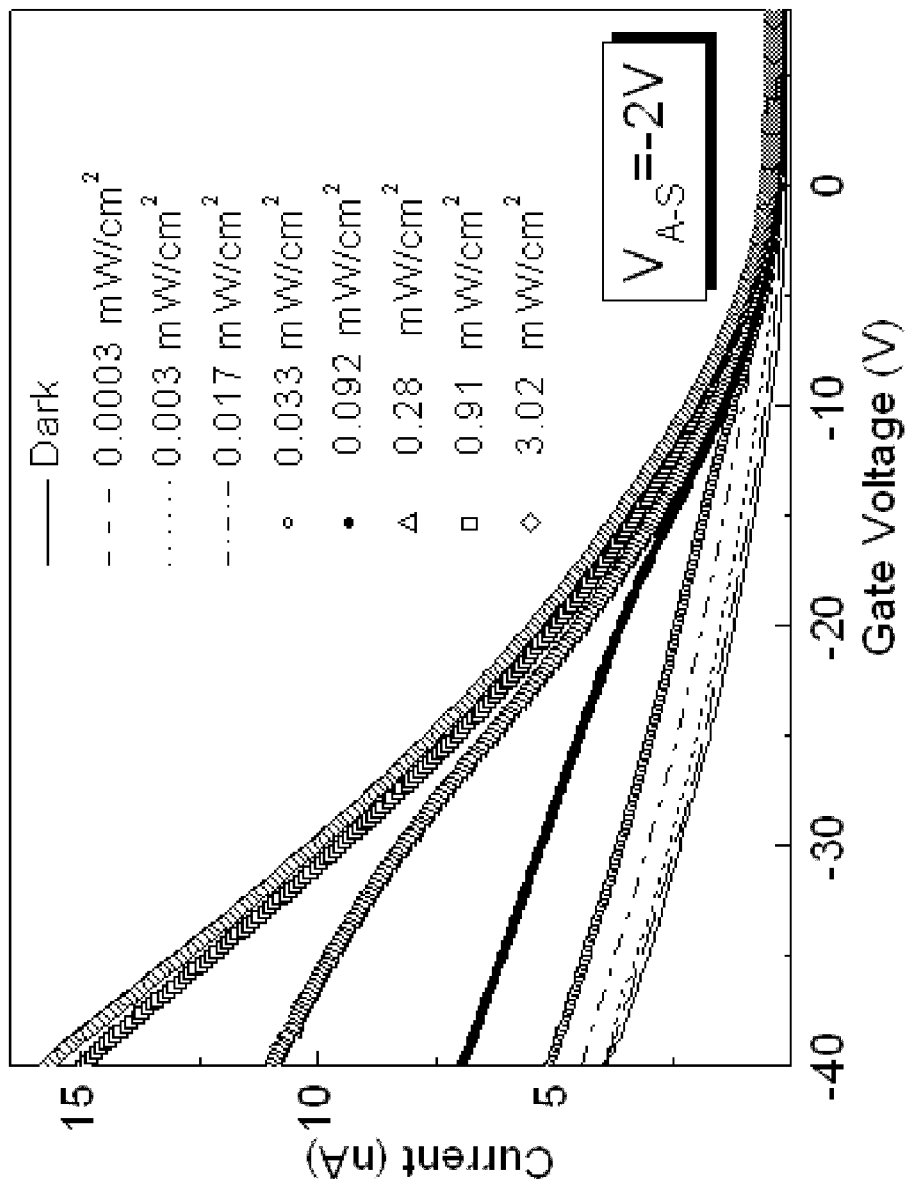
FIG. 13A shows the anode-source current of the integrated pixel illuminated according to embodiments of the invention at various intensities and under various gate voltages, when anode-source bias $V_{AS}$=−2 V and λ=578 nm.
Figure 13B:
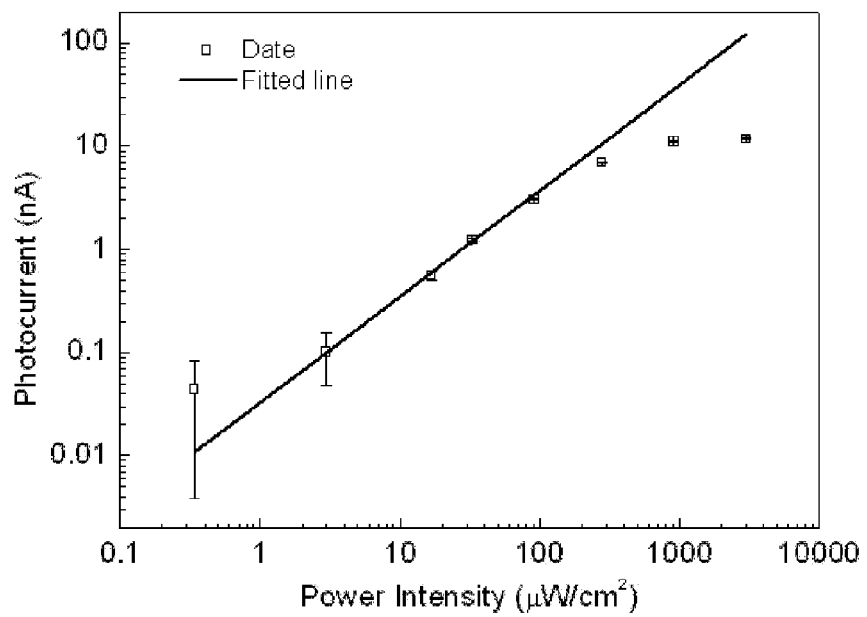
FIG. 13B shows the power intensity dependent photocurrent of an integrated pixel according to embodiments of the invention when the gate is in the ON state. The linear fit is of log(ΔI) to log(P). The slope of linear fit is 1.03±0.04 and intercept is −4.3±0.2, corresponding to a responsivity of 0.167 A/W.

The integrated pixel is characterized at an anode-source voltage, $V_{AS}$, of −2 V, with $V_{GS}$ varied from +10V to −40V, as shown in FIG. 13A. It was found that the anode-source current significantly increases with light intensity when the gate is turned on, and remains in an OFF state when $V_{GS}$=10V. The ON current of the integrated pixel is plotted in FIG. 13B as a function of light intensity, showing a linear dependence from 0.3 μW/cm², the lowest detectable power intensity, to 90 μW/cm² where the photocurrent deviates from linear behavior by ~1 dB. The dynamic range of 300, corresponding to an 8 bit gray scale, is lower than that of the discrete OPD since the photocurrent is limited by the ON current of the OTFT. With an optimized pentacene TFT, the ON state current can be increased by greater than 10 times.

Figure 13C:
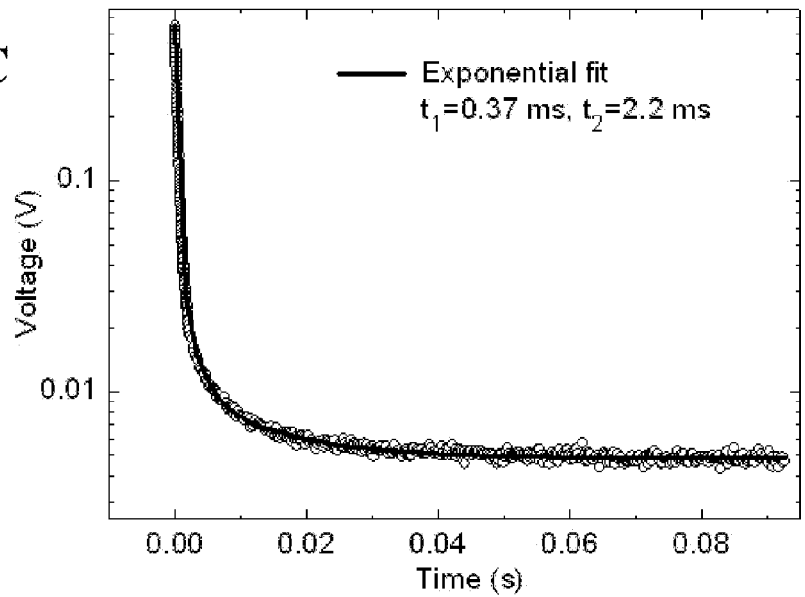
FIG. 13C shows the electrical pulse response of an integrated pixel according to embodiments of the invention due to a 99 ms long, gate-source voltage pulse of −15 V when anode-source voltage is −5V. The second order (solid line) fit indicates there are two time constants for the exponential decay.

FIG. 13C shows the response of the integrated pixel to a −15 V and 99 ms long electrical pulse applied to the transistor gate with $V_{AS}$=−5 V. The signal was measured on an oscilloscope with a 1 MΩ load much less than the channel resistance in the saturated (operating) regime. The exponential fit is shown as the solid line which represents two decay time constants. The first, $t_1$=370 μs, represents the switching time of the OTFT determined by the resistance-capacitance (RC) time required to charge the gate-source capacitance and apply the gate-source voltage through the load. The corresponding switching frequency, over 400 Hz, is sufficiently fast for operation at a 30 Hz frame rate, and can be increased to 67 kHz using a standard, 600 W video load, albeit with a corresponding reduction in signal amplitude. The second decay time, $t_2$=2.2 ms, corresponds to the discharge time through the OTFT to readout all the stored charges on $C_{OPD}$ during integration, equal to $t_2=R_{ON,TFT} \times C_{OPD}$. It is sufficiently fast for 15 rows to be sequentially output to achieve 30 Hz frame rate video standard. Since the readout time constant is determined by the ON resistance of the TFT, it is believed that a mobility of 0.1 cm²/Vs from an optimized pentacene TFT will be allow a 30 Hz frame rate to be achieved for a 128×128 passive sensor array. Alternatively, slower transistor response can be accommodated in large video FPA's by employing parallel read out of smaller, segmented array blocks.

Figure 13D:
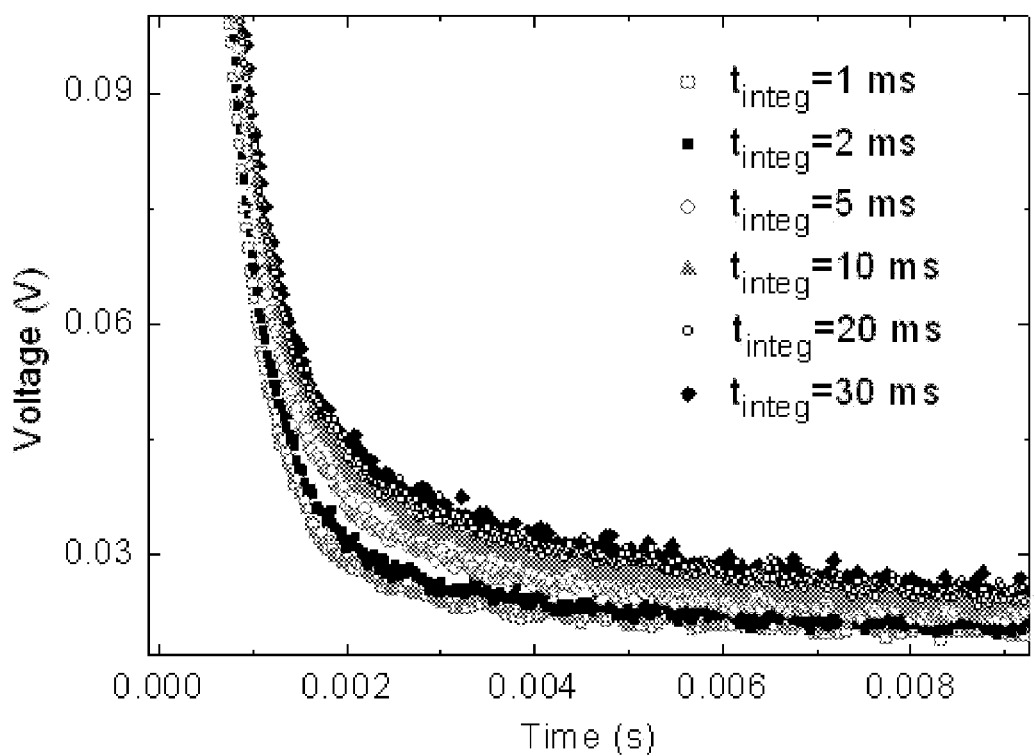
FIG. 13D shows the pulse response through a 1 MΩ load of an integrated pixel according to embodiments of the invention due to a 99 ms long, gate-source voltage pulse of −15 V with integration time varied from 1 ms, 2 ms, 5 ms, 10 ms, 20 ms and 30 ms. The solid line are bi-exponential fits to these curves with consistent time constants for all curves. The areas under these curves represent the total amount of charges that have been stored during integration time and that have been readout, thus change with various integration times.
Figure 14A:
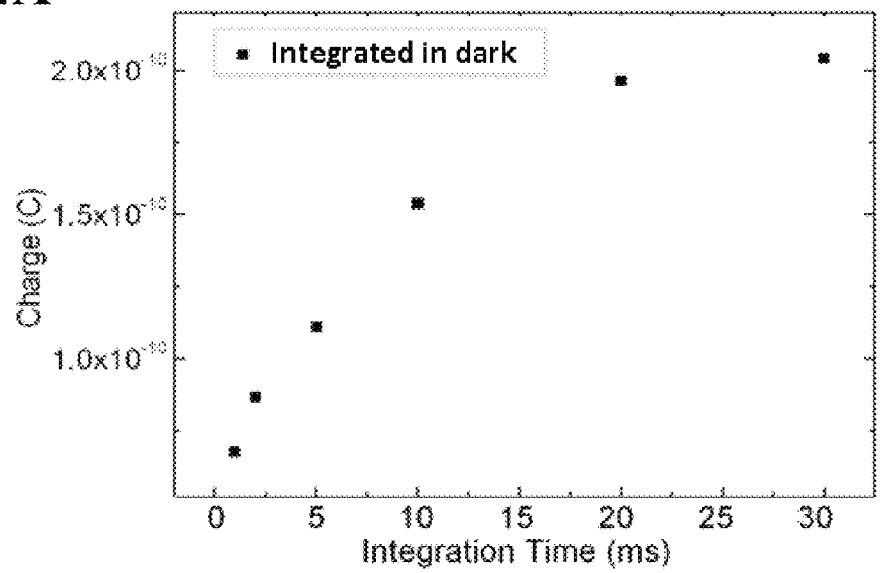
FIG. 14A shows a plot of the total amount of stored charges vs. various integration times when integrating in dark for a device according to embodiments of the invention. The charges are calculated from the integral under curves from 0 s to 90 ms shown as in FIG. 13D. The stored charges initially increase linearly with the integration time then start to saturate at ~30 ms.
Figure 14B:
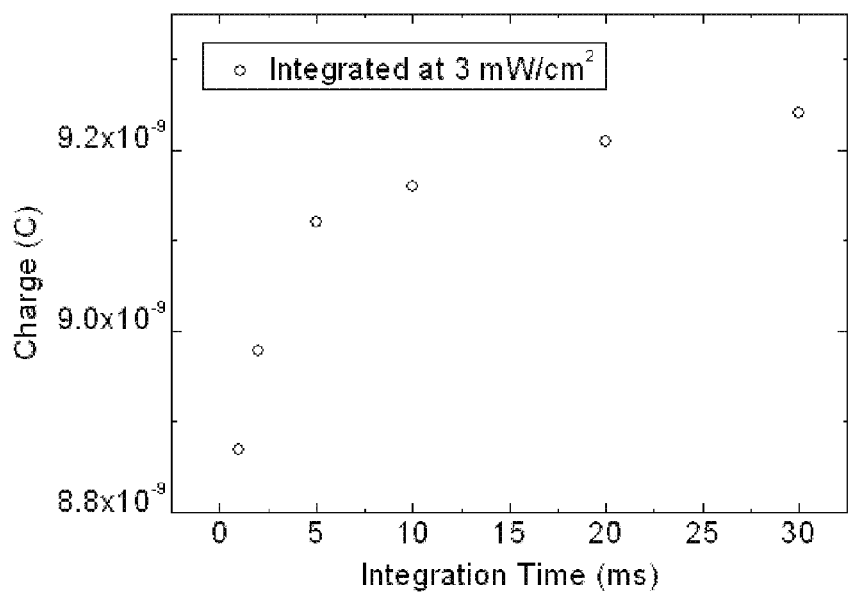
FIG. 14B shows a plot of total stored charges vs. various integration times at a higher illumination intensity of 3 mW/cm² during integration for a device according to embodiments of the invention. The charges also shows a linear increase at the beginning of the integration and then start to saturate at a shorter integration time, 10 ms, since the capacitor is saturated at a shorter time due to larger integrated current under higher illumination.

Because the second decay limits the readout of stored charges on the OPD during integration, the total amount of charges read out should depend on integration time until the OPD capacitor is saturated. As shown in FIG. 13D, by varying the integration time $t_{integ}$ from 1 ms to 30 ms in dark, the first and second decay times using a bi-exponential fit remain constant. The readout time constant is determined by the TFT resistance and OPD capacitance, and thus has no dependence on the integration time. However, the areas under the response curves indicates that the total amount of stored charges increases until the OPD saturates at $t_{integ}$=30 ms. FIG. 14A shows a plot of the total amount of stored charges vs. various integration times when integrating in dark. When the light illumination during integration is increased to 3 mW/cm², the integrated current is higher, which results in saturation of the OPD capacitor at a shorter integration time.

The 10×10 passive pixel sensor array comprised of monolithically integrated organic photodiodes with pentacene TFTs was found to have an 8-bit dynamic range and a readout time of 2.2 ms, sufficient for achieving at least a 30 Hz frame rate. Due to the room temperature fabrication techniques used, along with soft organic materials, it is feasible to build the organic passive pixel sensor array on flexible plastic or curved surfaces. The patterning process used in the present example was performed via multiple shadow masking. This technique also may be replaced by high resolution (e.g. <1 μm) stamping. It is also believed that the mobility of the pentacene TFTs can be improved by optimizing the growth conditions and gate dielectric properties, thus allowing the ON resistance of the TFTs to be reduced by at least a factor of ten.

The invention claimed is:

1. A first device comprising:
   an organic transistor comprising:
   a substrate;
   a drain electrode and a source electrode disposed over a first region of the substrate;
   a first layer comprising a transition metal oxide disposed over and in direct physical contact with the drain electrode and the source electrode;
   a channel layer comprising an organic hole conducting semiconductor disposed over the first layer, wherein a first portion of the channel layer is disposed between the drain electrode and the source electrode, a second portion of the channel layer is disposed over a portion of the drain electrode, and a third portion of the channel layer is disposed over a portion of the source electrode, a first organic-on-metal interface between the drain electrode and second portion of the channel layer, and a second organic-on-metal interface between the source electrode and the third portion of the channel layer; and
   a gate electrode disposed over the channel layer.

2. The first device of claim 1, wherein the channel layer is in direct physical contact with the first layer.

3. The first device of claim 1, wherein the transition metal is selected from the group consisting of molybdenum, tungsten, titanium, nickel, copper, and vanadium.

4. The first device of claim 1, wherein the transition metal oxide is $MoO_3$.

5. The first device of claim 1, wherein the channel layer comprises pentacene.

6. The first device of claim 1, wherein the drain and source electrodes comprise Au.

7. The first device of claim 1, wherein the gate electrode comprises parylene-C.

8. The first device of claim 1, further comprising an organic photodetector disposed over a second region of the substrate and adjacent to the organic transistor, wherein the drain electrode extends over the second region of the substrate to form an electrode of the organic photo detector.

9. The first device of claim 1, wherein the substrate surface, over which the layers are disposed, is a non-developable surface.

10. The first device of claim 1, wherein the first device is an imaging sensor.

11. The first device of claim 1, wherein the first device is a camera.

12. The first device of claim 1, wherein the first device comprises a plurality of organic transistors arranged in an array, and the organic transistor is one of the plurality of organic transistors.

13. A method of fabricating a device, comprising:
depositing a drain electrode and a source electrode over a substrate;
depositing a first layer comprising a transition metal over the drain electrode and the source electrode;
depositing a channel layer comprising an organic hole conducting material over the first layer, wherein a first portion of the channel layer is disposed between the drain electrode and the source electrode, a second portion of the channel layer is disposed over a portion of the drain electrode, and a third portion of the channel layer is disposed over a portion of the source electrode, a first organic-on-metal interface between the drain electrode and second portion of the channel layer and a second organic-on-metal interface between the source electrode and the third portion of the channel layer; and
depositing a gate electrode over the channel layer.

14. The method of claim 13, wherein the channel layer is in direct physical contact with the first layer.

15. The method of claim 13, wherein the transition metal is selected from the group consisting of molybdenum, tungsten, titanium, nickel, copper, and vanadium.

16. The method of claim 13, wherein the transition metal oxide is $MoO_3$.

17. The method of claim 13, wherein the channel layer comprises pentacene.

18. The method of claim 13, wherein the drain and source electrodes comprise Au.

19. The method of claim 13, wherein the gate electrode comprises parylene-C.

20. The method of claim 13, further comprising:
fabricating an organic photodetector over a second region of the substrate and adjacent to the organic transistor, wherein the drain electrode extends over the second region of the substrate to form an electrode of the organic photodetector.

* * * * *